United States Patent
Sato et al.

(10) Patent No.: US 9,487,446 B2
(45) Date of Patent: Nov. 8, 2016

(54) DIAMOND POLYCRYSTALLINE BODY AND METHOD FOR MANUFACTURING THE SAME, AND TOOL

(71) Applicant: Sumitomo Electric Industries, Ltd., Osaka-shi (JP)

(72) Inventors: Takeshi Sato, Itami (JP); Katsuko Yamamoto, Itami (JP); Kazuhiro Ikeda, Itami (JP); Hitoshi Sumiya, Itami (JP)

(73) Assignee: Sumitomo Electric Industries, Ltd., Osaka-shi (JP)

( * ) Notice: Subject to any disclaimer, the term of this patent is extended or adjusted under 35 U.S.C. 154(b) by 0 days.

(21) Appl. No.: 14/650,173

(22) PCT Filed: Dec. 5, 2013

(86) PCT No.: PCT/JP2013/082706
§ 371 (c)(1),
(2) Date: Jun. 5, 2015

(87) PCT Pub. No.: WO2014/088068
PCT Pub. Date: Jun. 12, 2014

(65) Prior Publication Data
US 2015/0315087 A1    Nov. 5, 2015

(30) Foreign Application Priority Data

Dec. 6, 2012 (JP) .................................. 2012-267202

(51) Int. Cl.
*C01B 31/06* (2006.01)
*C04B 35/52* (2006.01)
(Continued)

(52) U.S. Cl.
CPC ............... *C04B 35/52* (2013.01); *B01J 3/062* (2013.01); *B21C 3/025* (2013.01); *C01B 31/06* (2013.01);
(Continued)

(58) Field of Classification Search
CPC ... C01B 31/02; C01B 31/0206; C01B 31/06; C01B 31/065
See application file for complete search history.

(56) References Cited

U.S. PATENT DOCUMENTS 3,148,161 A * 9/1964 Wentorf, Jr. ............. B01J 3/062
                                                    252/502
8,226,922 B2 * 7/2012 Sumiya .................... B01J 3/062
                                                    423/276
(Continued)

FOREIGN PATENT DOCUMENTS

EP    1704913 A1    9/2006
EP    2738140 A1    6/2014
(Continued)

OTHER PUBLICATIONS

Notification of the First Office Action in Chinese Patent Application No. 2013800637776, dated Jan. 21, 2016.
(Continued)

*Primary Examiner* — Noah Wiese
(74) *Attorney, Agent, or Firm* — Venable LLP; Michael A. Sartori; F. Brock Riggs

(57) ABSTRACT

Provided are a diamond polycrystalline body having a longer life than conventional diamond polycrystalline bodies when it is slid, a method for manufacturing the same, and a tool. In a diamond polycrystalline body, at least one element whose sulfide or chloride has a melting point of less than or equal to 1000° C. is added thereto, and crystal grains have an average grain size of less than or equal to 500 nm. Thereby, wear of diamond can be suppressed, and the diamond polycrystalline body can have a longer life when it is slid.

13 Claims, 1 Drawing Sheet

(51) Int. Cl.
  *B21C 3/02* (2006.01)
  *C23C 14/34* (2006.01)
  *C23C 14/06* (2006.01)
  *C04B 35/626* (2006.01)
  *B01J 3/06* (2006.01)
  *C04B 35/645* (2006.01)

(52) U.S. Cl.
  CPC ......... *C04B 35/6261* (2013.01); *C04B 35/645* (2013.01); *C23C 14/0611* (2013.01); *C23C 14/34* (2013.01); *B01J 2203/062* (2013.01); *B01J 2203/068* (2013.01); *B01J 2203/0655* (2013.01); *B01J 2203/0685* (2013.01); *C04B 2235/3201* (2013.01); *C04B 2235/3213* (2013.01); *C04B 2235/3272* (2013.01); *C04B 2235/3281* (2013.01); *C04B 2235/3291* (2013.01); *C04B 2235/40* (2013.01); *C04B 2235/401* (2013.01); *C04B 2235/405* (2013.01); *C04B 2235/407* (2013.01); *C04B 2235/408* (2013.01); *C04B 2235/425* (2013.01); *C04B 2235/427* (2013.01); *C04B 2235/444* (2013.01); *C04B 2235/446* (2013.01); *C04B 2235/5445* (2013.01); *C04B 2235/725* (2013.01); *C04B 2235/785* (2013.01)

(56) References Cited

U.S. PATENT DOCUMENTS

| | | | |
|---|---|---|---|
| 2005/0110024 A1* | 5/2005 | Swain | C01B 31/06 257/77 |
| 2008/0022806 A1* | 1/2008 | Sumiya | B01J 3/062 75/244 |
| 2009/0305039 A1 | 12/2009 | Sumiya | |
| 2011/0061942 A1 | 3/2011 | DiGiovanni | |

FOREIGN PATENT DOCUMENTS

| | | |
|---|---|---|
| JP | 62-274034 A | 11/1987 |
| JP | 04-114966 A | 4/1992 |
| JP | 09-124394 A | 5/1997 |
| JP | 09-190873 A | 7/1997 |
| JP | 10-143654 A | 5/1998 |
| JP | 2007-055819 A | 3/2007 |
| JP | 2009-174039 A | 8/2009 |
| WO | WO-2005/065809 A1 | 7/2005 |

OTHER PUBLICATIONS

Extended European Search Report in European Patent Application No. 13859687.9, dated Jul. 7, 2016.

* cited by examiner

DIAMOND POLYCRYSTALLINE BODY AND METHOD FOR MANUFACTURING THE SAME, AND TOOL

TECHNICAL FIELD

The present invention relates to a diamond polycrystalline body, a method for manufacturing the same, and a tool. In particular, the present invention relates to a diamond polycrystalline body-used for a wear resistance member for performing plastic working using a lubricant, a method for manufacturing the same, and a tool made of the diamond polycrystalline body.

BACKGROUND ART

Conventionally, diamond has been used for wear resistance members represented by a drawing die, because of its extremely high hardness and excellent wear resistance.

For example, Japanese Patent Laying-Open-No. 09-124394 discloses a wear-resistant member in which a substance to serve as a base body is coated with a diamond film by a CVD method.

In addition, Japanese Patent Laying-Open No. 2009-174039 discloses a sliding member in which a surface of a base material is coated with a diamond-like-carbon film by a plasma chemical vapor deposition method.

CITATION LIST

Patent Document

PTD 1: Japanese Patent Laying-Open No. 09-124394
PTD 2: Japanese Patent Laying-Open No. 2009-174039

SUMMARY OF INVENTION

Technical Problem

However, diamond is worn rapidly when its friction surface has an extremely high temperature. For example, when the wire-drawing speed of a drawing die made, of diamond is increased, wear of the diamond proceeds rapidly. It is considered to be because the friction surface has a high temperature, the diamond reacts with oxygen or a member to be worked, and thereby so-called reaction wear proceeds. Accordingly, when diamond is used for a wear resistance member, the wear resistance member has a short life.

The present invention has been made to solve the aforementioned problem. A main object of the present invention is to provide a diamond polycrystalline body having a longer life than conventional diamond polycrystalline bodies when it produces friction, a method for manufacturing the same, and a tool.

Solution to Problem

In a diamond polycrystalline body in accordance with the present invention, at least one element whose sulfide or chloride has a inciting point of less than or equal to 1000° C. is added thereto, and crystal grains have an average grain size of less than or equal to 500 nm.

A tool in accordance with the present invention can use the diamond polycrystalline body M accordance with the present invention.

A method for manufacturing a diamond polycrystalline body in accordance with the present invention includes the steps of fabricating a mixture by mixing a graphite source material and a mixing source material which contains an element whose sulfide or chloride has a melting point of less than or equal to 1000° C.; fabricating a carbon material by crushing and mixing the mixture; and directly converting the carbon material into a diamond polycrystalline body.

A method for manufacturing a diamond polycrystalline body in accordance with the present invention includes the steps of fabricating a coating layer-provided carbon material by coating a surface of powder of a graphite source material with a coating layer which contains an element whose sulfide or chloride has a melting point of less than or equal to 1000° C.; and directly converting the coating layer-provided carbon material into a diamond polycrystalline body.

Advantageous Effects of Invention

According to the present invention, a diamond polycrystalline body having a longer life when, it produces friction, a method for manufacturing the same, and a tool using the diamond polycrystalline body can be provided.

DESCRIPTION OF EMBODIMENTS

Figure 1:
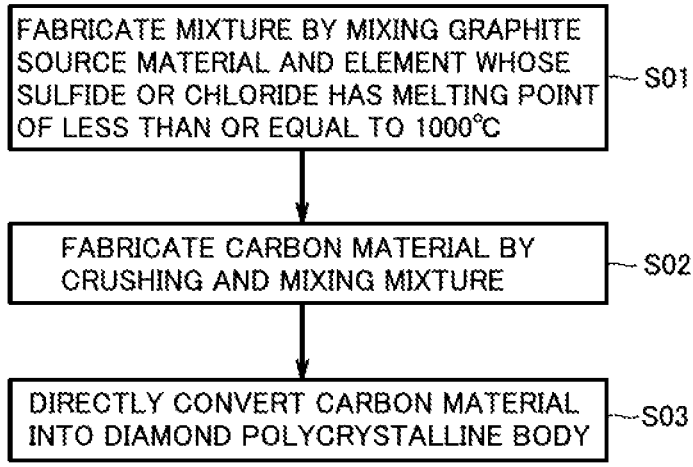
FIG. 1 is a flowchart showing a method for manufacturing a diamond polycrystalline body in accordance with the present embodiment.

Description of Embodiment of the Invention of the Present Application

As a result of earnest studies to solve the aforementioned problem, the inventors of the present invention have found that a wear resistance member can have a longer life by using a diamond polycrystalline body to which at least one element whose sulfide or chloride has a melting point of less than or equal to 1000° C. is added, and in which crystal grains have an average grain size of less than or equal to 500 nm, for a wear resistance member for performing plastic working using a lubricant.

In a diamond polycrystalline body in accordance with an embodiment of the present invention, at least one element whose sulfide or chloride has a melting point of less than or equal to 1000° C. is added thereto, and crystal grains have an average grain size of less than or equal to 500 nm.

Thereby, wear of the diamond polycrystalline body can be suppressed, and the diamond polycrystalline body can have a longer life when it produces friction.

The above diamond polycrystalline body contains at least one selected from the group consisting of a simple substance, a carbide, and an oxide of the element, and the at least one selected from the group consisting of a simple substance, a carbide, and an oxide of the element may be precipitated at grain boundaries of the crystal grains as a first phase. Further, the above diamond polycrystalline body may include a second phase which contains a simple substance, a carbide, or an oxide of the element, and is arranged at the grain boundaries of the crystal grains as the first phase. Furthermore, a Knoop hardness of more than or equal to 90

GPa can be obtained in the vicinity of the grain boundaries. Here, the wording "the vicinity of the grain boundaries" refers to a region in the first phase in which, when Knoop hardness measurement is performed at a test load of 0.5 N using a micro Knoop indenter, a Knoop indentation does not extend beyond a grain boundary and does not reach, for example, adjacent another crystal grain as the first phase. It is noted that, in this case, a Knoop hardness of more than or equal to 90 GPa can be obtained in any region of the first phase. As the above element, iron may be added by more than or equal to 0.5 ppm and less than or equal to 70 ppm. As the above element, strontium may be added by more than or equal to 40 ppm and less than or equal to 80 ppm. As the above element, iron and strontium may be added by more than or equal to 40.5 ppm and less than or equal to 100 ppm in total.

A tool in accordance with the embodiment of the present invention can use the diamond polycrystalline body in accordance with the embodiment of the present invention.

A method for manufacturing the diamond polycrystalline body in accordance with the embodiment of the present invention includes the steps of fabricating a mixture by mixing a graphite source material and a mixing source material which contains an element whose sulfide or chloride has a melting point of less than or equal to 1000° C.; fabricating a carbon material by crushing and mixing the mixture; and directly converting the carbon material into a diamond-polycrystalline body.

Thereby, the diamond polycrystalline body as described above can be fabricated.

The above mixing source material may contain at least one selected from the group consisting of a simple substance, a carbide, and an oxide of the element.

A method for manufacturing the diamond polycrystalline body in accordance with the embodiment of the present invention includes the steps of fabricating a coating layer-provided carbon material by coating a surface of powder of a graphite source material with a coating layer which contains an element whose sulfide or chloride has a melting point of less than or equal to 1000° C.; and directly converting the coating layer-provided carbon material into a diamond polycrystalline body.

Thereby, the diamond polycrystalline body as described above can be fabricated.

In the above step of fabricating the coating layer-provided carbon material, the surface of the powder of the graphite source material may be coated with the element by a sputtering method. In the above step of fabricating the coating layer-provided carbon material, the coating layer may contain at least one selected from the group consisting of a simple substance, a carbide, and an oxide of the element. The above element may include at least one of iron and strontium. In the above step of directly converting, conditions of a pressure of more than or equal to 10 GPa and less than or equal to 30 GPa, and a heating temperature of more than or equal to 1500° C. and less than or equal to 3000° C. can be used.

Details of Embodiment of the Invention of the Present Application

Hereinafter, the embodiment of the present invention will be described. In the diamond polycrystalline body of the present embodiment, iron (Fe) is added thereto as an element whose sulfide has a melting point of less than or equal to 1000° C., and crystal grains as the first phase have an average grain size of less than or equal to 500 nm. Fe is contained in the second phase arranged at the grain boundaries of the crystal grains as the first phase. Here, the first phase is made of a diamond single phase which does not substantially contain a binder, a sintering aid, a catalyst, and the like. On the other hand, the second phase does not substantially contain a binder, a sintering aid, a catalyst, and the like, and is made of a simple substance, a carbide, or an oxide of Fe.

That is the diamond polycrystalline body of the present embodiment has a closely-packed crystalline structure with extremely few voids in which the crystal grains made of a diamond single phase and having an average grain size of less than or equal to 500 nm are directly and firmly coupled to each other. The second phase containing the added element is formed at the grain boundaries of the above crystal grains. Accordingly, the above diamond polycrystalline body has excellent hardness properties even at a high temperature.

When Fe (including a simple substance, a carbide, and an oxide thereof) added to the above diamond polycrystalline body is exposed at a surface of the diamond polycrystalline body and heated by friction or the like, it reacts with chlorine (Cl) contained in a chlorine-containing lubricant and produces iron chloride ($FeCl_3$). Since $FeCl_3$ has a melting point of 302° C., when the diamond polycrystalline body is heated to the above melting point or more, the chloride is melted into a liquid. Accordingly, when the diamond polycrystalline body is used as a tool and produces friction with a member to be worked, $FeCl_3$ is liquefied by frictional heat and thus the diamond polycrystalline body and the member to be worked are in contact with each other at at least a portion of a contact surface therebetween, with iron chloride which has a low shear stress and is liquefied interposed therebetween. Thereby, the friction coefficient of the above contact surface is reduced, and thus the wear amount of the diamond polycrystalline body when it is used for a wear resistance member can be reduced. Therefore, the diamond polycrystalline body and the tool equipped with the diamond polycrystalline body can have longer lives.

An Fe concentration in the above diamond polycrystalline body is more than or equal to 0.5 ppm and less than or equal to 70 ppm. Thereby, the diamond polycrystalline body can have a high hardness (a Knoop hardness of more than or equal to 90 GPa) even in the vicinity of the second phase, and can also achieve the effect caused by Fe as described above. It is noted that the effect caused by Fe as described above is not significantly exhibited in a diamond polycrystalline body having an Fe concentration of less than 0.5 ppm. On the other hand, a diamond polycrystalline body having an Fe concentration of more than 70 ppm has a Knoop hardness of less than 90 GPa in the vicinity of the second phase, and thus its hardness is insufficient to be used for a tool.

It has been confirmed from the examples described later that a diamond polycrystalline body in which crystal grains made of a diamond single phase have an average grain size of 200 nm and to which Fe as an added element is added by 0.2 ppm, and a diamond polycrystalline body in which the average grain size is 200 nm and to which Fe is added by 20 ppm have longer lives as drawing dies, when compared with conventional drawing dies. However, it is considered that the same effect will be achieved by adopting a diamond polycrystalline body in which crystal grains made of a diamond single phase have an average grain size of less than or equal to 500 nm and which has an Fe concentration of more than or equal to 0.5 ppm and less than or equal to 70 ppm.

The tool in accordance with the present embodiment is equipped with the diamond polycrystalline body of the present embodiment, and is used to perform plastic working using a lubricant. Examples of the tool can include a drawing die, a scribing tool, and the like. As described above, when the diamond polycrystalline body of the present embodiment is used for example as a wear resistance tool and produces friction with a member to be worked together with a chlorine-containing lubricant, liquefied. $FeCl_3$ is produced by frictional heat. Accordingly, when the tool of the present embodiment produces friction with the member to be worked, the tool is in contact with the member to be worked at at least a portion of a contact surface therebetween, with iron chloride which has a low shear stress and is liquefied interposed therebetween. Thereby, the friction coefficient of the above contact surface is reduced, and thus the wear amount of the diamond polycrystalline body can be reduced. Therefore, the tool in accordance with the present embodiment can have a longer life when performing plastic working using a lubricant.

Next, the method for manufacturing the diamond polycrystalline body in accordance with the present embodiment will be described with reference to FIG. 1. The method for manufacturing the diamond polycrystalline body in accordance with the present embodiment includes the steps of fabricating a mixture (S01) by mixing a graphite source material and Fe metal powder as an element whose sulfide has a melting point of less than or equal to 1000° C.; fabricating a carbon material (S02) by crushing and mixing the mixture; and directly converting the carbon material into a diamond polycrystalline body (S03) under high temperature and high pressure conditions.

First, in step (S01), a graphite source material and Fe metal powder are prepared and mixed to fabricate a mixture. As the graphite source material, the one having an extremely low impurity concentration is prepared. The Fe metal powder is prepared in an amount with which its concentration in the mixture is set to a predetermined Fe concentration in the diamond polycrystalline body. Specifically, in order to fabricate a diamond polycrystalline body containing 30 ppm of Fe, the graphite source material and the Fe metal powder are prepared such that the concentration in the mixture is set to 30 ppm.

Next, in step (S02), the mixture of the graphite source material and the Fe metal powder fabricated in the previous step (S01) is crushed and mixed by a planetary ball mill, to fabricate a powdered carbon material.

Next, in step (S03), the carbon material fabricated in the previous step (S02) is directly converted into a diamond polycrystalline body, using a super high-pressure high-temperature generator. Conversion into a diamond polycrystalline body is performed under conditions of a pressure of more than or equal to 10 GPa and a temperature of more than or equal to 1500° C. Thereby, a diamond polycrystalline body to which Fe is added by 30 ppm can be obtained. Here, the diamond polycrystalline body includes the first phase as crystal grains made of a diamond single phase which does not substantially contain a binder, a sintering aid, a catalyst, and the like, and having an average grain size of less than or equal to 500 nm. The diamond polycrystalline body also includes the second phase in which Fe is segregated as a simple substance, a carbide, or an oxide. The second phase is formed at the grain boundaries of the crystal grains as the first phase. It is noted that, in this step (S03), upper limit values of the pressure and the temperature can be set to any values at which diamond is thermodynamically stable, and the upper limit values of the pressure and the temperature are actually determined by the super high-pressure high-temperature generator used. For example, upper limits which allow industrially stable manufacturing are a pressure of about 30 GPa and a temperature of about 3000° C.

It has been confirmed from the examples described later that the diamond polycrystalline body obtained in step (S03) under conditions of a pressure of about 15 GPa and a temperature of about 2300° C. has a longer life as a drawing die, when compared with conventional drawing dies. However, it is considered that a diamond polycrystalline body having the same properties can be obtained even under conditions of a pressure of more than or equal to about 10 GPa and a temperature of more than or equal to about 1500° C.

As described above, the diamond polycrystalline body in accordance with the present embodiment includes the first phase as crystal grains made of a diamond single phase and having an average grain size of less than or equal to 500 nm, and the second phase which is formed at the grain boundaries of the crystal grains and in which Fe is segregated. Accordingly, the diamond polycrystalline body in accordance with the present embodiment has excellent wear resistance properties caused by containing Fe, in addition to high-hardness properties of diamond.

Although crystal grains made of a diamond single phase have an average grain size of less than or equal to 500 nm in the diamond polycrystalline body in accordance with the present embodiment, the average grain size is preferably less than or equal to 300 nm. Thereby, the diamond polycrystalline body can have a further closely-packed crystalline structure with extremely few voids, and can have more excellent hardness properties.

Although the second phase is formed and Fe constitutes the second phase in the diamond polycrystalline body of the present embodiment, the present invention is not limited thereto. As long as Fe is segregated as the second phase at the grain boundaries of the crystal grains made of a diamond single phase, Fe may constitute the second phase as at least one selected from the group consisting of a simple substance, a carbide, and an oxide. Specifically, at least one selected from the group consisting of a simple substance, a carbide, and an oxide of Fe may be precipitated at the grain boundaries of the first phase. Further, at least one selected from the group consisting of a simple substance, a carbide, and an oxide of Fe may be crystallized at the grain boundaries of the first phase. In the method for manufacturing the diamond polycrystalline body of the present embodiment, depending on the temperature in step (S03), for example, Fe grains in the vicinity of graphite within the carbon material may be crystallized as a carbide of Fe, and other Fe grains may be crystallized as a simple substance of Fe. Also in this case, the diamond polycrystalline body can have the effect of improving wear resistance by Fe.

Further, although Fe is added to the diamond polycrystalline body of the present embodiment, the present invention is not limited thereto. Any element may be added to the diamond polycrystalline body of the present invention as long as a sulfide or chloride thereof has a melting point of less than or equal to 1000° C.

Here, the reason for adopting an element whose sulfide or chloride has a melting point of less than or equal to 1000° C. is because, when the diamond polycrystalline body is used for a wear resistance member, the temperature of a contact portion between the diamond polycrystalline body and a member to be worked reaches up to about 1000° C., by frictional heat. That is, since the diamond polycrystalline body contains an element whose sulfide or chloride has a melting point of less than or equal to 1000° C., it can produce a liquid sulfide or chloride at an interface of the above contact portion, and reduce the friction coefficient.

When plastic working is performed using a chlorine-containing lubricant as described above, the diamond polycrystalline body may contain any element whose chloride has a melting point of less than or equal to 1000° C. On the other hand, when plastic working is performed using a sulfur-containing lubricant, the diamond polycrystalline body may contain any element whose sulfide has a melting point of less than or equal to 1000° C. In this case, the diamond polycrystalline body and the member to be worked are in contact with each other at at least a portion of the contact surface therebetween, with a sulfide which has a low shear stress and is liquefied interposed therebetween. Thus, the friction coefficient of the contact surface can be reduced.

It is noted that the diamond polycrystalline body of the present invention is sufficient as long as it contains an element whose sulfide or chloride has a melting point lower than a temperature assumed to be reached by friction with the member to be worked when it is used as a tool. In other words, any element may be added to the diamond polycrystalline body as long as a sulfide or chloride thereof has a melting point which is less than a temperature of the diamond polycrystalline body reached when it produces friction. For example, an element whose sulfide or chloride has a melting point of less than or equal to 500° C. is added to a diamond polycrystalline body used for a working application in which the reached temperature is about 500° C. As an element whose sulfide or chloride has a low melting point of 100 to 500° C., for example, at least one selected from silver (Ag), copper (Cu), and the like may be adopted, instead of iron. Further, as an element whose sulfide or chloride has a high melting point of 500 to 1000° C., for example, one selected from strontium (Sr), sodium (Na), and the like may be adopted.

In addition, a plurality of elements whose sulfides or chlorides have different melting points may be added. Thereby, even in a case where there is a change in the frictional heat generated between the tool using the above diamond polycrystalline body and the member to be worked, wear of the diamond polycrystalline body can be suppressed to achieve a longer life. Here, it is noted that a compound formed by combining the plurality of elements whose sulfides or chlorides have different melting points may be precipitated at the grain boundaries in the diamond polycrystalline body. In this case, since sulfides or chlorides of the elements and the compound have different melting points, there is also a possibility that a liquid sulfide or chloride cannot be sufficiently produced when the diamond polycrystalline body produces friction. In a case where a plurality of elements whose sulfides or chlorides have different melting points are added, it is preferable to select the elements to be added, amounts to be added, and the like, considering the above note.

The above diamond polycrystalline body may contain an element whose sulfide and chloride have melting points of less than or equal to 1000° C. Thereby, a diamond polycrystalline body and a tool capable of improving wear resistance can be provided, irrespective of whether a lubricant used during plastic working is a chlorine-containing lubricant or a sulfur-containing lubricant.

It is noted that, when the element added to the diamond polycrystalline body is Sr in the above case, it is preferable to set its concentration to more than or equal to 40 ppm and less than or equal to 80 ppm. When the added element is Na, it is preferable to set its concentration to more than or equal to 0.1 ppm and less than or equal to 50 ppm. Further, when Fe and Sr are added, it is preferable to set their total concentration to more than or equal to 40.5 ppm and less than or equal to 100 ppm. Furthermore, when the added element is Ag or Cu, it is preferable to set its concentration to more than or equal to 0.1 ppm and less than or equal to 100 ppm. If each element has a concentration which is less than a lower limit value, the effect of suppressing wear of the diamond polycrystalline body and extending its life cannot be significantly achieved. In addition, if each element has a concentration which is more than an upper limit value, the hardness in the vicinity of a region where each element is segregated is less than 90 GPa, and thus the diamond polycrystalline body is not suitable to be used for a tool which requires a high hardness.

Although the Fe metal powder is used as an added element in step (S01) in the method for manufacturing the diamond polycrystalline body in accordance with the present embodiment, the present invention is not limited thereto. A mixture may be fabricated by mixing a graphite source material and a mixing source material which contains at least one selected from the group consisting of a simple substance, a carbide, and an oxide of an added element. Also in this manner, a diamond polycrystalline body having properties equal to those of the diamond polycrystalline body of the present embodiment can be obtained.

Further, although the carbon material is fabricated by crushing and mixing the mixture using a planetary ball mill in step (S02) in the method for manufacturing the diamond polycrystalline body in accordance with the present embodiment, the present invention is not limited thereto. The carbon material may be fabricated by any method capable of crushing and mixing the mixture with high uniformity.

Figure 2:
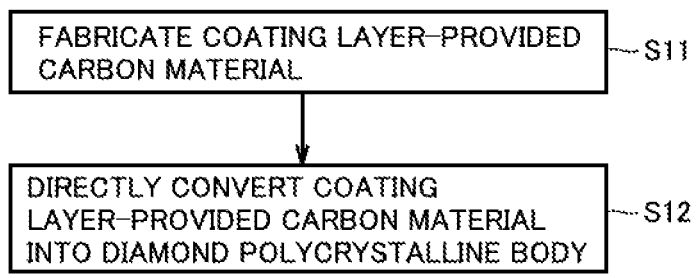
FIG. 2 is a flowchart showing a modification of the method for manufacturing the diamond polycrystalline body in accordance with the present embodiment.

Further, although the carbon material is fabricated by crushing and mixing the Fe metal powder and the graphite source material in the method for manufacturing the diamond polycrystalline body in accordance with the present embodiment, the present invention is not limited thereto. Referring to FIG. 2, for example, a coating-provided carbon material may be fabricated (S11) by coating a surface of powder of a graphite source material with Fe, and the coating-provided carbon material may be directly converted into a diamond polycrystalline body (S12) under high temperature and high pressure conditions. The surface of the powder of the graphite source material may be coated with Fe by, for example, a sputtering method, an evaporation method, or the like. Also in this manner, the diamond polycrystalline body in accordance with the present invention can be manufactured.

Hereinafter, examples of the present invention will be described.

EXAMPLES

Diamond polycrystalline bodies in accordance with Examples 1 and 2 were fabricated by a method described below. First, the diamond polycrystalline body of Example 1 was fabricated by mixing an Fe powder simple substance and a graphite source material to fabricate a mixture, and converting the mixture into a diamond polycrystalline body under a pressure of 15 GPa and at a temperature of 2300° C. The diamond polycrystalline body of Example 1 had 20 ppm of Fe added thereto, and had an average grain size of 200 nm.

The diamond polycrystalline body of Example 2 was fabricated by mixing an Na powder simple substance and a graphite source material to fabricate a mixture, and converting the mixture into a diamond polycrystalline body under a pressure of 15 GPa and at a temperature of 2300° C. The diamond polycrystalline body of Example 2 had 0.3 ppm of Na added thereto, and had an average grain size of 200 nm.

A diamond polycrystalline body of a comparative example was fabricated by converting a graphite source material into a diamond polycrystalline body under a pressure of 15 GPa and at a temperature of 2300° C., without adding an added element. The diamond polycrystalline body of the comparative example had an average grain size of 200 nm.

Wear resistances of the diamond polycrystalline bodies of Examples 1, 2 and the comparative example obtained as described above were measured by a technique described below.

Figure 3:
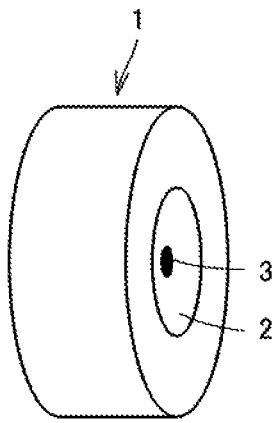
FIG. 3 is a view for illustrating a die in Examples 1 and 2 of the present invention.

Wear resistances of the diamond polycrystalline bodies of Examples 1, 2 and the comparative example Mien they were used for dies to perform drawing (wire-drawing) on SUS316 were evaluated. Referring to FIG. 3, a die 1 having a hole 3 with a hole diameter of ϕ30 µm in which each of diamond polycrystalline bodies 2 of Examples 1, 2 and the comparative example was applied to a working surface was used to draw SUS316 at a wire-drawing speed of 1000 m/minute, and a drawing time taken until the hole diameter in die 1 expands to ϕ30.5 µm was measured. On this occasion, a chlorine-containing lubricant was used as a lubricant.

As a result of measurement, it was able to be confirmed that the above drawing time is four times longer in the dies using diamond polycrystalline bodies 2 of Examples 1, 2, than that in the die using diamond polycrystalline body 2 of the comparative example. That is, it was able to be confirmed that the diamond polycrystalline bodies of Examples 1, 2 have longer lives because they contain an element whose sulfide or chloride has a melting point of less than or equal to 1000° C.

Although the embodiment and the examples of the present invention have been described above, the embodiment and the examples described above can also be modified in various manners. Further, the scope of the present invention is not limited to the embodiment and the examples described above. The scope of the present invention is defined by the scope of the claims, and is intended to include any modifications within the scope and meaning equivalent to the scope of the claims.

INDUSTRIAL APPLICABILITY

The diamond polycrystalline body, the method for manufacturing the same, and the tool of the present invention are particularly advantageously applied to a wear resistance member for performing plastic working using a lubricant.

REFERENCE SIGNS LIST

1: die; 2: diamond poly-crystalline body; 3: hole.

The invention claimed is:

1. A diamond polycrystalline body to which at least one element whose sulfide or chloride has a melting point of less than or equal to 1000° C. is added, and
in which crystal grains have an average grain size of less than or equal to 500 nm,
the diamond polycrystalline body containing at least one selected from the group consisting of a simple substance, a carbide, and an oxide of said element, and
including a second phase arranged at grain boundaries of said crystal grains as a first phase.

2. The diamond polycrystalline body according to claim 1, having a Knoop hardness of more than or equal to 90 GPa in vicinity of said grain boundaries.

3. The diamond polycrystalline body according to claim 1, wherein, as said element, iron is added by more than or equal to 0.5 ppm and less than or equal to 70 ppm.

4. The diamond polycrystalline body according to claim 1, wherein, as said element, strontium is added by more than or equal to 40 ppm and less than or equal to 80 ppm.

5. The diamond polycrystalline body according to claim 1, wherein, as said element, iron and strontium are added by more than or equal to 40.5 ppm and less than or equal to 100 ppm in total.

6. A tool using a diamond polycrystalline body as recited in claim 1.

7. A method for manufacturing a diamond polycrystalline body, comprising the steps of:
fabricating a mixture by mixing a graphite source material and a mixing source material which contains an element whose sulfide or chloride has a melting point of less than or equal to 1000° C.;
fabricating a carbon material by crushing and mixing said mixture; and
directly converting said carbon material into a diamond polycrystalline body including crystal grains under high temperature and high pressure conditions,
wherein said diamond polycrystalline body includes a second phase which contains at least one selected from the group consisting of a simple substance, a carbide, and an oxide of said element, and is arranged at grain boundaries of said crystal grains as a first phase.

8. The method for manufacturing the diamond polycrystalline body according to claim 7, wherein said mixing source material contains at least one selected from the group consisting of a simple substance, a carbide, and an oxide of said element.

9. A method for manufacturing a diamond polycrystalline body, comprising the steps of:
fabricating a coating layer-provided carbon material by coating a surface of powder of a graphite source material with a coating layer which contains an element whose sulfide or chloride has a melting point of less than or equal to 1000° C.; and
directly converting said coating layer-provided carbon material into a diamond polycrystalline body.

10. The method for manufacturing the diamond polycrystalline body according to claim 9, wherein, in said step of fabricating said coating layer-provided carbon material, the surface of the powder of said graphite source material is coated with said element by a sputtering method.

11. The method for manufacturing the diamond polycrystalline body according to claim 9, wherein, in said step of fabricating said coating layer-provided carbon material, said coating layer contains at least one selected from the group consisting of a simple substance, a carbide, and an oxide of said element.

12. The method for manufacturing the diamond polycrystalline body according to claim 7, wherein said element includes at least one of iron and strontium.

13. The method for manufacturing the diamond polycrystalline body according to claim 7, wherein, in said step of directly converting, conditions of a pressure of more than or equal to 10 GPa and less than or equal to 30 GPa, and a heating temperature of more than or equal to 1500° C. and less than or equal to 3000° C. are used.

* * * * *